(12) United States Patent
Dosho et al.

(10) Patent No.: US 7,254,507 B2
(45) Date of Patent: Aug. 7, 2007

(54) ANALOG CIRCUIT AUTOMATIC CALIBRATION SYSTEM

(75) Inventors: Shiro Dosho, Osaka (JP); Naoshi Yanagisawa, Osaka (JP); Masaomi Toyama, Osaka (JP); Keijiro Umehara, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 138 days.

(21) Appl. No.: 10/915,345

(22) Filed: Aug. 11, 2004

(65) Prior Publication Data

US 2005/0049809 A1  Mar. 3, 2005

(30) Foreign Application Priority Data

Aug. 27, 2003  (JP) ............................. 2003-302986

(51) Int. Cl.
*G01R 35/02* (2006.01)
(52) U.S. Cl. ................ 702/107; 702/69; 327/147; 327/156; 375/376
(58) Field of Classification Search ............. 702/57, 702/58, 85, 107; 327/156, 147; 324/601, 324/130; 375/376; 341/120
See application file for complete search history.

(56) References Cited

U.S. PATENT DOCUMENTS

| | | | |
|---|---|---|---|
| 4,412,299 A * | 10/1983 | Huffman | 702/72 |
| 5,404,250 A | 4/1995 | Hase et al. | |
| 6,552,618 B2 * | 4/2003 | Nelson et al. | 331/11 |
| 6,646,512 B2 * | 11/2003 | Abassi et al. | 331/17 |
| 6,650,193 B2 | 11/2003 | Endo et al. | |
| 6,680,887 B2 | 1/2004 | Shihara et al. | |

FOREIGN PATENT DOCUMENTS

| | | |
|---|---|---|
| CN | 1345036 A | 4/2002 |
| CN | 1380741 A | 11/2002 |
| JP | 11-195983 | 7/1999 |
| JP | 2000-49597 | 2/2000 |

OTHER PUBLICATIONS

Jitter on PLL Clocks, Lecroy. 2001, Jitter & Timing Analysis Training Presentation. Altera Corporation, [Page URL: http://www.altera.com/support/devices/pll_clock/jitter/pll-jitter.html].*
Yamazaki, Hiroshi et al. "An Accurate Center Frequency Tuning Scheme for 450-kHz CMOS Gm-C Bandpass Filters", IEEE Journal of Solid-State Circuits, vol. 34, No. 12, pp. 1691-1697, Dec. 1999.

* cited by examiner

*Primary Examiner*—Manuel L Barbee
(74) *Attorney, Agent, or Firm*—McDermott Will & Emery LLP

(57) ABSTRACT

An analog circuit automatic calibration system for calibrating an object circuit that is an analog circuit having a characteristic changing with an input set value. The system includes: a set value storage section for storing a value and outputting the value to the object circuit as the set value; a characteristic detection section for detecting the characteristic of the object circuit; a first characteristic change section for determining the set value so that the characteristic of the object circuit is optimized; a second characteristic change section for updating the set value so that the characteristic of the object circuit is maintained, using an algorithm different from that used in the first characteristic change section; and a selector for selecting either one of the outputs of the first and second characteristic sections to enable the selected one to be stored in the set value storage section.

10 Claims, 14 Drawing Sheets

FIG. 3

| ADDRESS | INCREASE/DECREASE VALUE OF REGISTER A | INCREASE/DECREASE VALUE OF REGISTER B | INCREASE/DECREASE VALUE OF REGISTER C |
|---|---|---|---|
| 0 | 1 | 1 | 1 |
| 1 | 1 | 1 | -1 |
| 2 | 1 | -1 | 1 |
| 3 | 1 | -1 | -1 |
| 4 | -1 | 1 | 1 |
| 5 | -1 | 1 | -1 |
| 6 | -1 | -1 | 1 |
| 7 | -1 | -1 | -1 |

|  | INV1 | INV2 | INV3 |
|---|---|---|---|
| STATE 0 | H | L | L |
| STATE 1 | H | L | H |
| STATE 2 | L | L | H |
| STATE 3 | L | H | H |
| STATE 4 | L | H | L |
| STATE 5 | H | H | L |

10,254,507 B2

ANALOG CIRCUIT AUTOMATIC CALIBRATION SYSTEM

CROSS REFERENCE TO RELATED APPLICATIONS

This Non-provisional application claims priority under 35 U.S.C. §119(a) on Patent Application No. 2003-302986 filed in Japan on Aug. 27, 2003, the entire contents of which are hereby incorporated by reference.

BACKGROUND OF THE INVENTION

The present invention relates to a control technology of optimizing the quality of a signal output from an analog circuit.

Analog circuits find difficulty in keeping its quality constant. The reason is that analog circuits are affected by not only an absolute variation in the characteristics of transistors constituting the circuits but also a relative variation in the characteristics between different transistors. In other words, the characteristics of an analog circuit are directly affected by the characteristic distributions of transistors constituting the analog circuit. Therefore, in system LSI including both analog circuits and digital circuits, if the characteristic distributions of transistors greatly fluctuate due to an unexpected variation in fabrication process, the yield of the system LSI will be greatly reduced. Analog circuits are also affected largely by the use environment. That is, the circuit characteristics greatly change with the influences of the operating voltage, the ambient temperature and the like, and this may adversely affect the entire system using the analog circuits.

To solve the above problem, systems permitting automatic calibration of analog circuits are known. As such systems, generally known are a system in which optimization is made at the startup of an analog circuit and no more made thereafter and a system in which optimization is made at fixed intervals.

A related technology is disclosed in "An Accurate Center Frequency Tuning Scheme for 450-kHz CMOS Gm-C Bandpass Filters", IEEE Journal of Solid-State Circuits, Vol. 34, No. 12, December 1999, pp. 1691-1697, for example.

However, the systems described above have a problem that if the characteristics of an analog circuit to be calibrated change with a fluctuation in temperature and a fluctuation in power supply voltage, the subsequent circuit characteristics will no more be optimal.

SUMMARY OF THE INVENTION

An object of the present invention is providing a system for automatically calibrating an analog circuit to ensure its operation with optimum characteristics at all times.

Specifically, the present invention is directed to an analog circuit automatic calibration system for calibrating an object circuit that is an analog circuit having a characteristic changing with an input set value, the system including: a set value storage section for storing a value and outputting the value to the object circuit as the set value; a characteristic detection section for detecting a characteristic of the object circuit and outputting the results; a first characteristic change section for determining the set value so that the characteristic of the object circuit is optimized and outputting the results; a second characteristic change section for determining a value updated from the set value so that the characteristic of the object circuit is maintained, using an algorithm different from that used by the first characteristic change section; and a selector for selecting either one of the outputs of the first and second characteristic sections, to enable the selected one to be stored in the set value storage section.

According to the invention described above, the characteristic of the object circuit can be optimized with the first characteristic change section, and the characteristic can be maintained with the second characteristic change section. The selector selects one of the outputs of the first and second characteristic change sections as required. Therefore, even when the situation changes, the characteristic of the object circuit can be optimized and then the optimized state can be maintained. In other words, the object circuit is ensured to have its optimum characteristic at all times.

Preferably, the first characteristic change section determines the set value using a global search algorithm, and the second characteristic change section determines the updated value using a steepest descent algorithm.

According to the invention described above, global search is performed using the global search algorithm to optimize the characteristic of the object circuit, and then local search is performed using the steepest descent algorithm to maintain the optimum state.

Preferably, the system further includes: an abnormal event detection section for detecting occurrence of an abnormal event in the circuit, and outputting a signal indicating the detection; and a control section for controlling the selector to select the output of the first characteristic change section if the abnormal event detection section detects occurrence of an abnormal event, and otherwise select the output of the second characteristic change section.

According to the invention described above, in the case of occurrence of an abnormal event in the object circuit, the set value is determined by the first characteristic change section to optimize the characteristic of the object circuit. Therefore, even in the event of a large change in environment, the object circuit is ensured to have its optimum characteristic at all times.

Preferably, the system further includes a control section for controlling the selector to select the output of the first characteristic change section at startup of the object circuit, and select the output of the second characteristic change section after the determination of the set value to be output to the object circuit by the first characteristic change section.

According to the invention described above, the set value is determined by the first characteristic change section at startup of the object circuit, to enable optimization of the characteristic of the object circuit without fail.

Preferably, the second characteristic change section starts the updating of the set value if the characteristic detected by the characteristic detection section satisfies a predetermined start condition, and thereafter terminates the updating of the set value if a predetermined end condition is satisfied.

According to the invention described above, occurrence of an event of changing the set value when no change is necessary resulting in worsening the characteristic of the object circuit can be prevented.

Preferably, the object circuit changes its characteristic with a plurality of set values, and the first characteristic change section selects a combination of values, among a plurality of combinations each having a plurality of values, so that with supply of the selected combination of values, the characteristic of the object circuit is optimized, and outputs the results.

According to the invention described above, even in the case that the characteristic of the object circuit changes with a plurality of set values, the characteristic can be optimized.

Preferably, the object circuit changes its characteristic with a plurality of set values, and the second characteristic change section selects a vector, among a plurality of vectors each having a plurality of components corresponding to the plurality of set values, so that with addition of corresponding components of the selected vector to the plurality of set values, the characteristic of the object circuit becomes closest to an optimum characteristic, updates the plurality of set values by adding the corresponding components of the selected vector to the plurality of set values, and outputs the results.

According to the invention described above, even in the case that the characteristic of the object circuit changes with a plurality of set values, it is possible to determine the best vector for changing the plurality of set values so that the characteristic is maintained.

Preferably, the object circuit is a phase-locked loop circuit.

According to the invention described above, the characteristic of a phase-locked loop circuit can be optimized.

Preferably, the object circuit includes a voltage-controlled oscillator, and the characteristic detection section detects jitter of the voltage-controlled oscillator as a characteristic of the object circuit.

According to the invention described above, jitter of the voltage-controlled oscillator can be reduced.

Preferably, the characteristic detection section samples logical levels at a plurality of points in the voltage-controlled oscillator according to a reference clock supplied to the object circuit, and determines jitter of the voltage-controlled oscillator based on the resultant logical levels.

According to the invention described above, jitter of the voltage-controlled oscillator can be determined only from the change in logical level at the timing of the reference clock.

As described above, according to the present invention, in which one from two different algorithms is selected according to the situation, an analog circuit automatic calibration system that optimizes the characteristics of an analog circuit at all times can be provided.

BRIEF DESCRIPTION OF THE DRAWINGS

FIG. 3 is a view showing an example of register value increase/decrease table stored in a second characteristic change section in FIG. 1.

DESCRIPTION OF THE PREFERRED EMBODIMENTS

Hereinafter, preferred embodiments of the present invention will be described with reference to the accompanying drawings.

Embodiment 1

Figure 1:
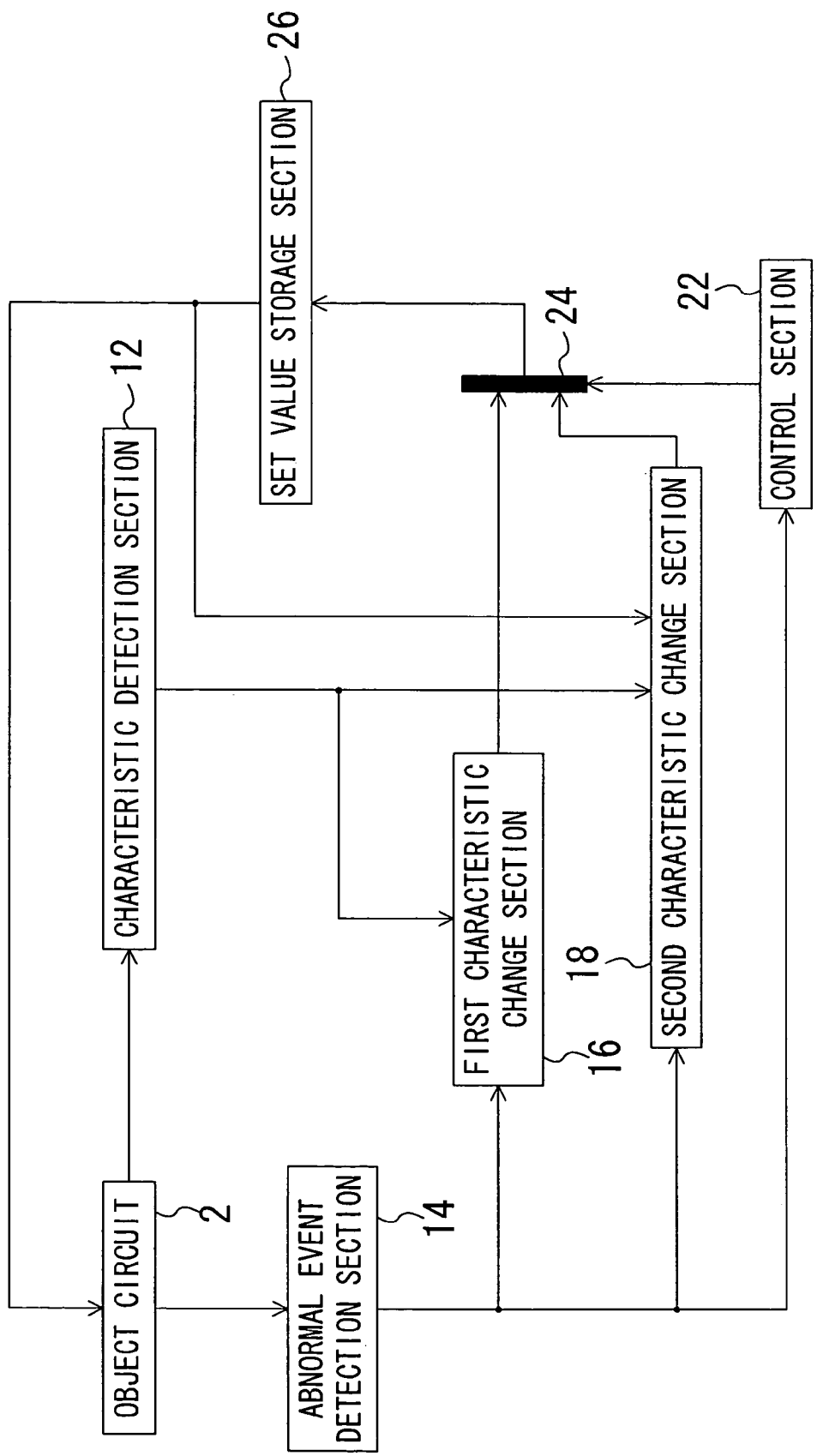
FIG. 1 is a block diagram of an analog circuit automatic calibration system of Embodiment 1 of the present invention.

FIG. 1 is a block diagram of an analog circuit automatic calibration system of Embodiment 1 of the present invention. The analog circuit automatic calibration system of FIG. 1 includes a circuit 2 to be calibrated (object circuit 2), a characteristic detection section 12, an abnormal event detection section 14, first and second characteristic change sections 16 and 18, a control section 22, a selector 24 and a set value storage section 26.

The object circuit 2, as the object to be calibrated by the analog circuit automatic calibration system of FIG. 1, is an analog circuit configured to change its characteristics according to a plurality of set values output from the set value storage section 26. The characteristic detection section 12 detects a characteristic (jitter, for example) of the object circuit 2, and outputs the detection results to the first and second characteristic change sections 16 and 18.

The abnormal event detection section 14 detects whether or not an abnormal event is occurring in the object circuit 2 from the output of the object circuit 2 and outputs, if occurring, an abnormal event detection signal to the first and second characteristic change sections 16 and 18 and the control section 22. The abnormal event as used herein refers to an event that the state of the circuit largely deviates from the steady state thereof. For example, if the object circuit 2 is a phase-locked loop (PLL) circuit, the abnormal event includes loss of synchronization and occurrence of a phase error exceeding a predetermined value.

The control section 22 instructs the selector 24 which one should be selected, the output of the first characteristic change section 16 or the output of the second characteristic change section 18. The selector 24 selects either one of the outputs of the first and second characteristic change sections 16 and 18, and outputs the results to the set value storage section 26. The set value storage section 26 includes registers A, B and C, for example. The registers A, B and C store the values output from the selector 24 and outputs the values to the object circuit 2 as the set values.

When a characteristic of an analog circuit or the like is expressed as a function, algorithms for searching for an input variable that gives a desired characteristic are largely classified into two types. One type is a global search algorithm and the other is a steepest descent algorithm.

The global search algorithm is an algorithm in which almost the entire area of a solution space created with input variables of a function is searched, to select variables with which the value of the function is as close to the optimum value as possible. This algorithm takes time, but has a feature that a combination of variables giving the optimum value as the value of the function can be found without fail.

The steepest descent algorithm (steepest descent method) is a technique in which a variable vector is moved in a direction of the steepest slope in a solution space (direction in which the value of the function is closest to the optimum value), to determine the optimum value of the function with a small number of steps. This algorithm, which is an algorithm for local search, can determine the optimum value in a short time in many cases, but has a problem that if the value of the function falls to its minimum, it converges to the minimum, failing to determine the optimum value.

The analog circuit automatic calibration system of FIG. 1 has the first and second characteristic change sections 16 and 18 for the object circuit 2 of which characteristics are to be calibrated. The first characteristic change section 16 determines the set values to be output to the object circuit 2 so that the characteristics of the object circuit 2 are optimized, using the global search algorithm, and outputs the results. The second characteristic change section 18 determines values updated from the set values output to the object circuit 2 so that the characteristics of the object circuit 2 are maintained, using the steepest descent algorithm, and outputs the results. In other words, the second characteristic change section 18 determines the set values to be output to the object circuit 2 based on the set values already output to the object circuit 2 as the reference so that the characteristics of the object circuit 2 are improved to be the best at the time of the calibration. In this system, one of the outputs of the two characteristic change sections 16 and 18 is selected and used according to the situation. It is therefore possible to calibrate the characteristics of the object circuit 2 to be always optimal.

Figure 2:
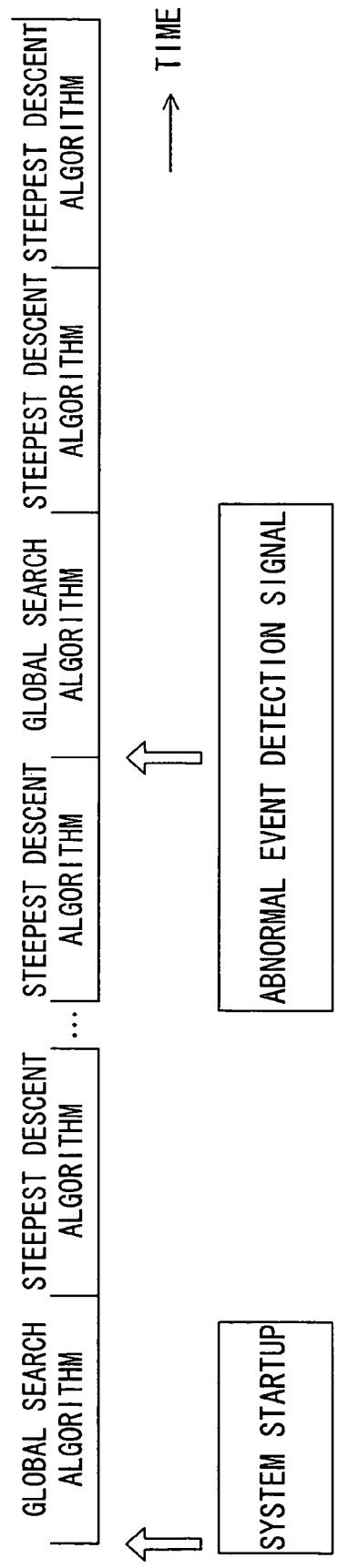
FIG. 2 is a sequence diagram showing application of algorithms in the system of FIG. 1.

FIG. 2 is a sequence diagram showing application of the algorithms in the system of FIG. 1. At the startup, the control section 22 first instructs the selector 24 to select the output of the first characteristic change section 16. This results in that the system of FIG. 1 searches for values optimal as the set values for the object circuit 2 using the global search algorithm.

To state more specifically, the first characteristic change section 16 has a register value setting table containing a plurality of combinations of three values to be stored in the registers A, B and C of the set value storage section 26. The first characteristic change section 16 selects, from the setting table, a combination of values with which the characteristic of the object circuit 2 output from the characteristic detection section 12 can be optimized, and outputs the results as an optimum register vector. The registers A, B and C store corresponding components of the optimum register vector therein, and output the stored values as the set values for the object circuit 2.

The control section 22 then instructs the selector 24 to select the output of the second characteristic change section 18. This results in that the system of FIG. 1 changes the values stored in the registers A, B and C using the steepest descent algorithm and supplies the changed values to the object circuit 2 as the set values. This control using the steepest descent algorithm is repeated thereafter following a change in circuit characteristics.

If an abnormal event detection signal is output from the abnormal event detection section 14 during the control of the circuit characteristics using the steepest descent algorithm, the control section 22 instructs the selector 24 to select the output of the first characteristic change section 16. This results in that the system of FIG. 1 again searches for values optimal as the set values for the object circuit 2 using the global search algorithm.

The control section 22 then instructs the selector 24 to select the output of the second characteristic change section 18, to allow the system of FIG. 1 to repeat the control using the steepest descent algorithm. With the time sequence described above, the system of FIG. 1 can perform automatic calibration that can realize optimization of the characteristics of the object circuit 2 at all times.

Figure 4:
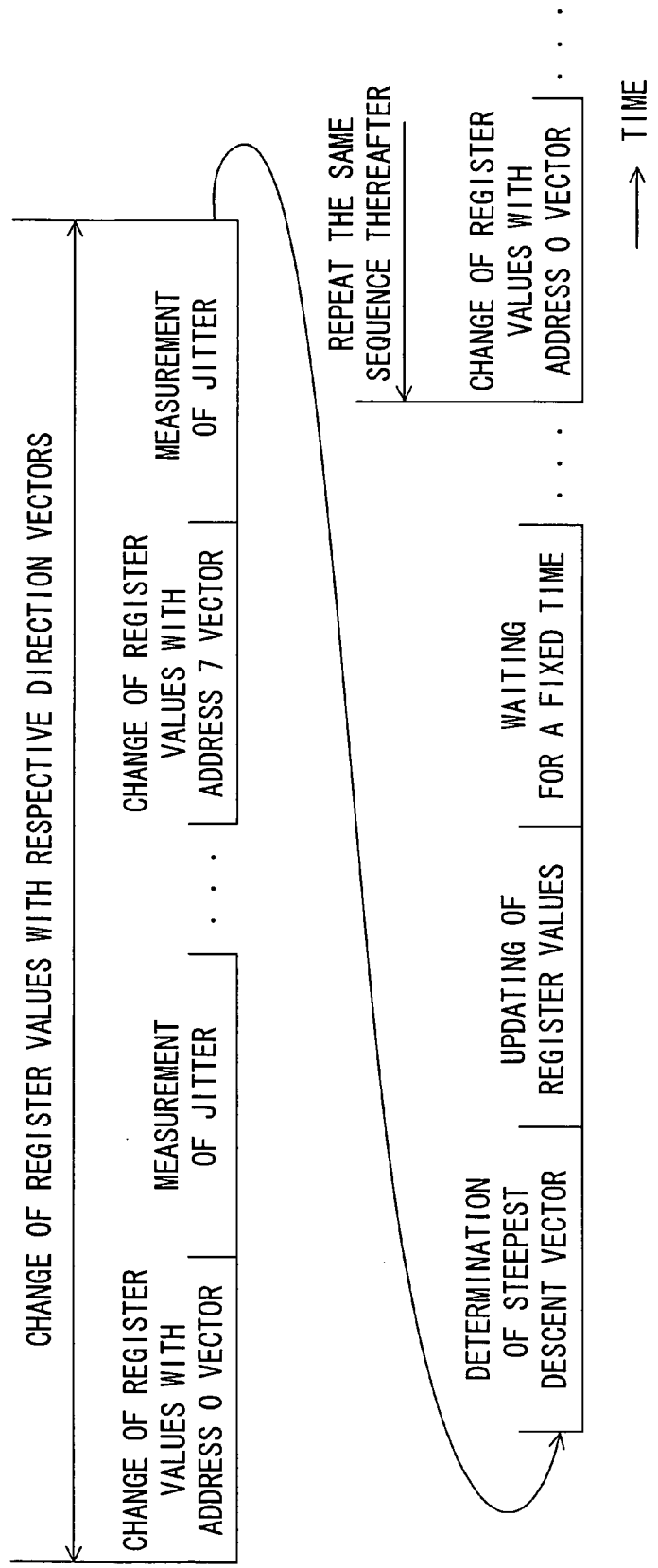
FIG. 4 is a sequence diagram adopted in use of a steepest descent algorithm in the system of FIG. 1.

FIG. 3 is a view showing an example of register value increase/decrease table stored in the second characteristic change section 18 in FIG. 1. FIG. 4 is a sequence diagram adopted by the system of FIG. 1 in use of the steepest descent algorithm. The search for optimum values in the steepest descent algorithm will be described in detail.

Assuming that the values of the registers A, B and C are increased or decreased only by one in the steepest descent algorithm, a total of eight combinations of increase/decrease values are allowed as shown in FIG. 3. These eight combinations are herein respectively called address 0 to 7 direction vectors.

Assume that the search for optimum values by the global search algorithm has been made and the optimum values have been set in the registers A, B and C of the set value storage section 26. The second characteristic change section 18 stores the current set values of the registers A, B and C therein.

First, the second characteristic change section 18 adds the address 0 direction vector to the values of the registers A, B and C. That is, since the components of the address 0 direction vector are (1, 1, 1) as shown in FIG. 3, the second characteristic section 18 adds 1 to the respective values of the registers A, B and C stored therein, and outputs the added values to be stored in the registers A, B and C. The new values in the registers A, B and C are then given to the object circuit 2 as the set values. The characteristic detection section 12 detects a characteristic (jitter, for example) of the object circuit 2 provided with the new set values, and outputs the results to the second characteristic change section 18. The second characteristic change section 18 stores the received characteristic therein.

Likewise, the second characteristic change section 18 adds the components of the address 1 direction vector to the stored values of the registers A, B and C, and then stores the resultant characteristic of the object circuit 2. The same processing is also performed for the address 2 to 7 direction vectors.

Subsequently, the second characteristic change section 18 selects a direction vector among the address 0 to 7 direction vectors that can most enhance the characteristics of the object circuit 2, and determines the selected direction vector as the steepest descent vector. The second characteristic change section 18 then adds the components of the steepest descent vector to the stored values of the registers A, B and C, outputs the updated values to update the values in the registers A, B and C, and then waits for a fixed time. Thereafter, the search for optimum values by the steepest descent algorithm is repeated in the same manner.

In the above description, a direction vector was added to the values of the registers A, B and C. Alternatively, a vector obtained by multiplying a direction vector by a predetermined step value may be added. In this case, however, it must be ensured that the object circuit 2 is prevented from falling in an abnormal state due to the change of the register values. In view of this, the step value is normally 1.

As described above, the automatic calibration of the object circuit 2 using the steepest descent algorithm is realized by repeating the sequence shown in FIG. 4. The steepest descent algorithm may be repeated continuously throughout the operation time except for the time of application of the global search algorithm. Alternatively, the steepest descent algorithm may be repeated at predetermined intervals during the operation except for the time of application of the global search algorithm. Otherwise, limitation may be placed on the time period during which the set values are updated using the steepest descent algorithm in the following manner.

Figure 5:
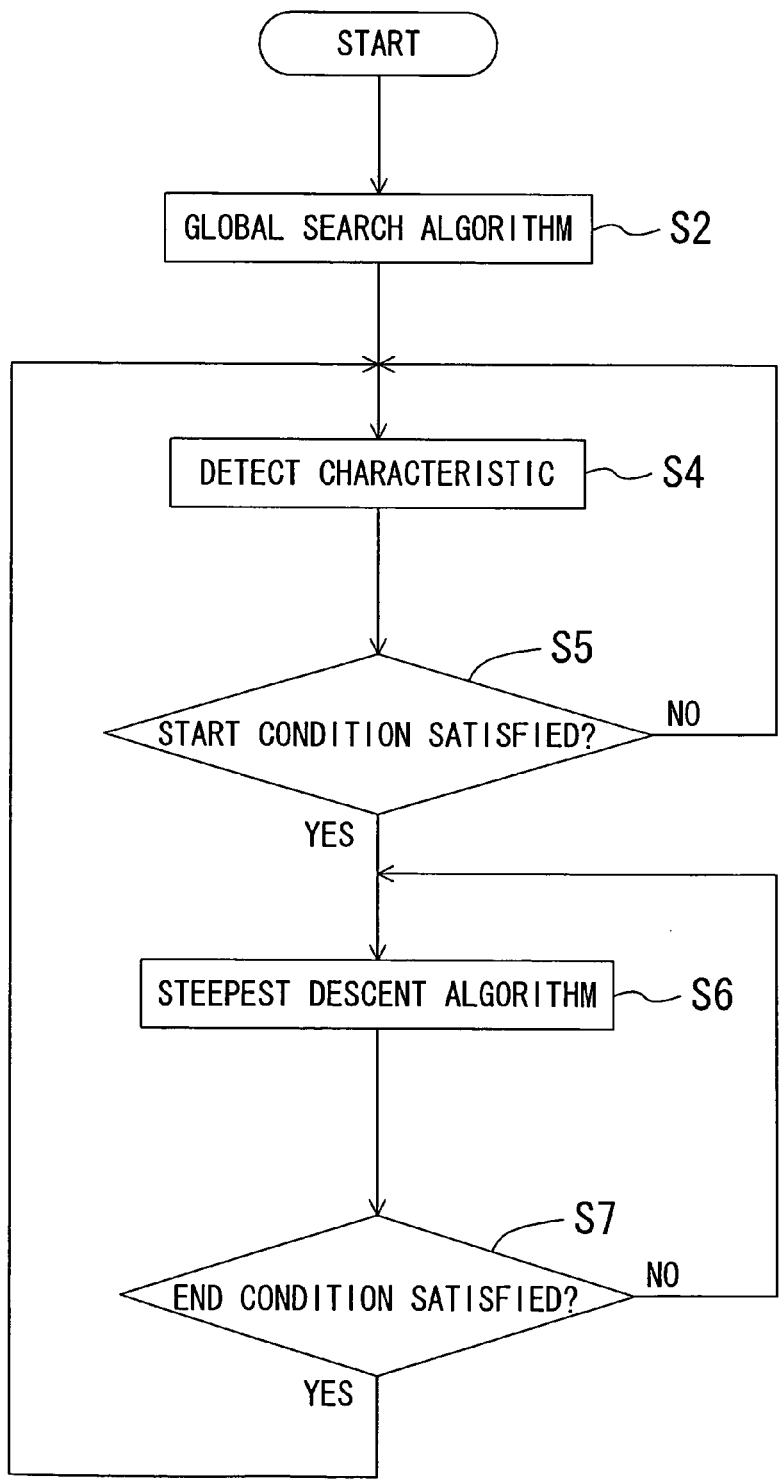
FIG. 5 is a flowchart showing a flow of control in the system of FIG. 1.

FIG. 5 is a flowchart showing a flow of control in the analog circuit automatic calibration system of FIG. 1. In step S2, the control section 22 instructs the selector 24 to select the output of the first characteristic change section 16. The first characteristic change section 16 determines the set values to be output to the object circuit 2 so that the characteristics of the object circuit 2 are optimized, using the global search algorithm, and outputs the results.

In step S4, the characteristic detection section 12 detects jitter, for example, as a characteristic of the object circuit 2 and outputs the results. In step S5, the second characteristic change section 18 determines whether or not the resultant characteristic satisfies a predetermined start condition, that is, whether or not the detected jitter exceeds a threshold, for example. If the predetermined start condition is satisfied, the process proceeds to step S6. Otherwise, the process returns to step S4.

In step S6, the second characteristic change section 18 updates the set values output to the object circuit 2 so that the characteristics of the object circuit 2 are maintained, using the steepest descent algorithm, and outputs the updated values. In step S7, the second characteristic change section 18 determines whether or not a predetermined end condition is satisfied. If the predetermined end condition is satisfied, the process returns to step S4. Otherwise, the process returns to step S6. As the end condition, the condition that the differential value of jitter becomes smaller than a predetermined value, that the jitter value becomes smaller than a predetermined value, that the updating of the set values using the steepest descent algorithm has been made by a predetermined number of times or the like may be adopted.

Figure 6:
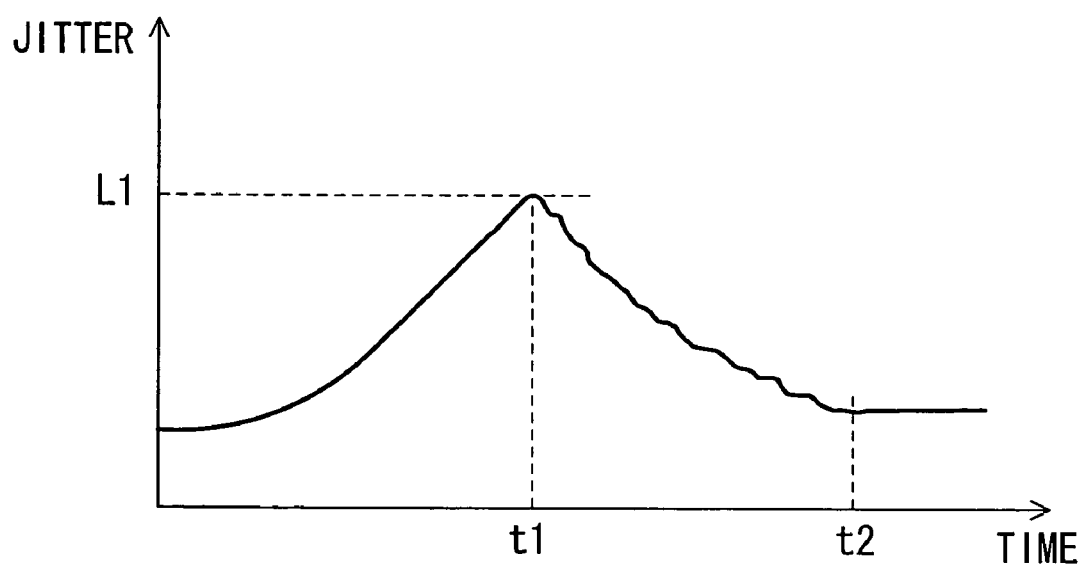
FIG. 6 is a graph showing an example of change in a characteristic of an object circuit obtained in the control of FIG. 5.

FIG. 6 is a graph showing an example of change in the characteristic of the object circuit 2 observed when the control of FIG. 5 is performed. In FIG. 6, the jitter increases, and once the jitter, for example, is determined exceeding a threshold L1 at time t1 (step S5), the second characteristic change section 18 performs local search using the steepest descent algorithm to update the set values (step S6). The processing in step S6 is repeated until the differential value of the jitter, for example, is determined smaller than a predetermined value at time t2 (step S7), and then the process returns to step S4.

In the control of FIG. 5, the updating of the set values using the steepest descent algorithm is not performed until the start condition is satisfied. This can prevent occurrence of an event of changing the set values when no change is necessary resulting in worsening the characteristics of the object circuit 2.

Embodiment 2

Figure 7:
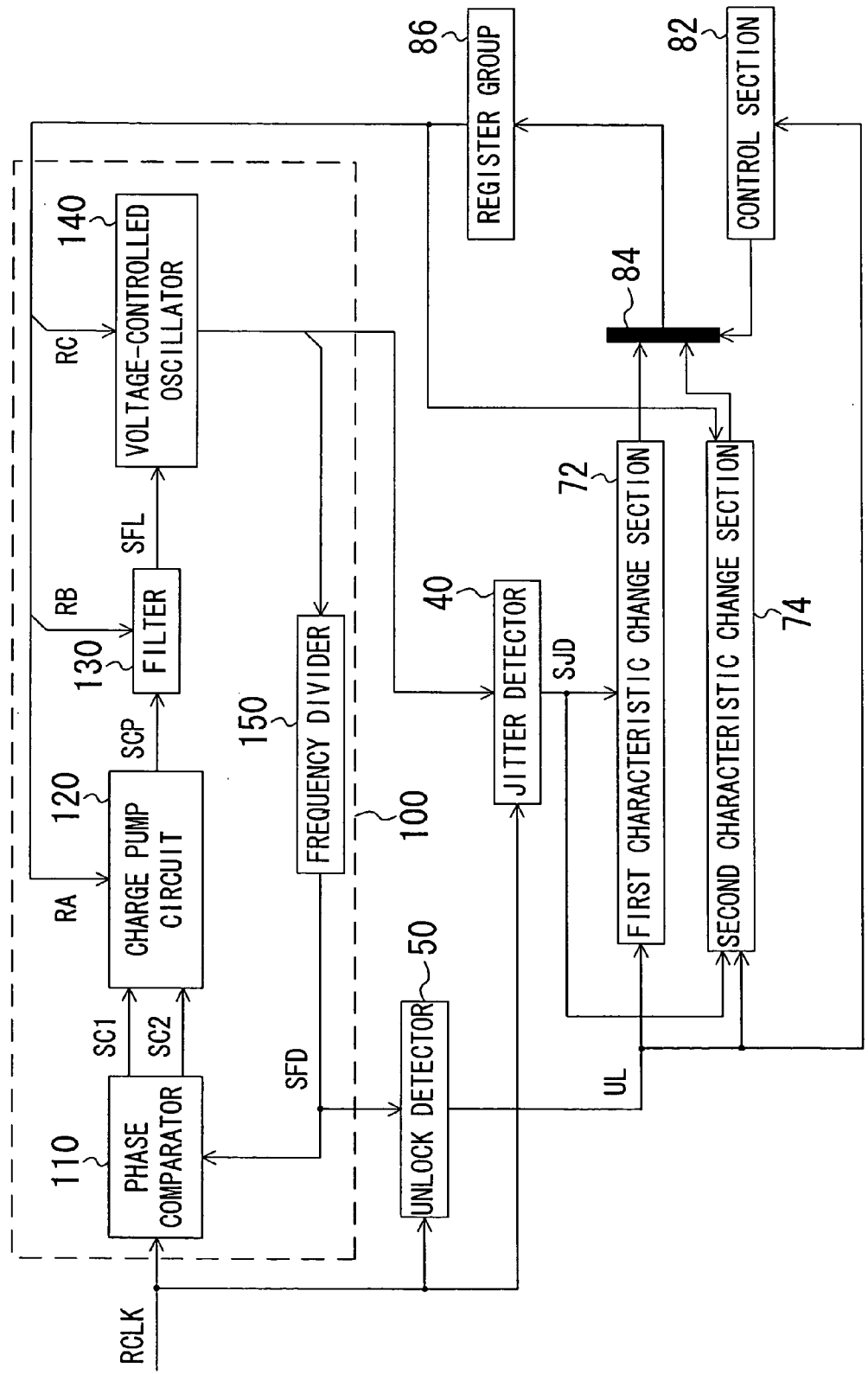
FIG. 7 is a block diagram of an analog circuit automatic calibration system of Embodiment 2 of the present invention.

In Embodiment 2, a specific example in which the object circuit is a phase-locked loop (PLL) circuit will be described. FIG. 7 is a block diagram of an analog circuit automatic calibration system of Embodiment 2 of the present invention. The analog circuit automatic calibration system of FIG. 7 includes a PLL circuit 100 as the object circuit to be calibrated, a jitter detector 40 as the characteristic detection section, an unlock detector 50 as the abnormal event detection section, first and second characteristic change sections 72 and 74, a control section 82, a selector 84 and a register group 86 as the set value storage section.

The PLL circuit 100 includes a phase comparator 110, a charge pump circuit 120, a filter 130, a voltage-controlled oscillator 140 and a frequency divider 150. The register group 86 includes registers A, B and C, of which outputs RA, RB and RC are given to the charge pump circuit 120, the filter 130 and the voltage-controlled oscillator 140, respectively. The frequency divider 150 divides the output of the voltage-controlled oscillator 140, and sends its output SFD to the phase comparator 110 and the unlock detector 50. The phase comparator 110 compares the phase of the divider output SFD with that of the reference clock RCLK, and outputs the phase comparison results SC1 and SC2 to the charge pump circuit 120.

Figure 8:
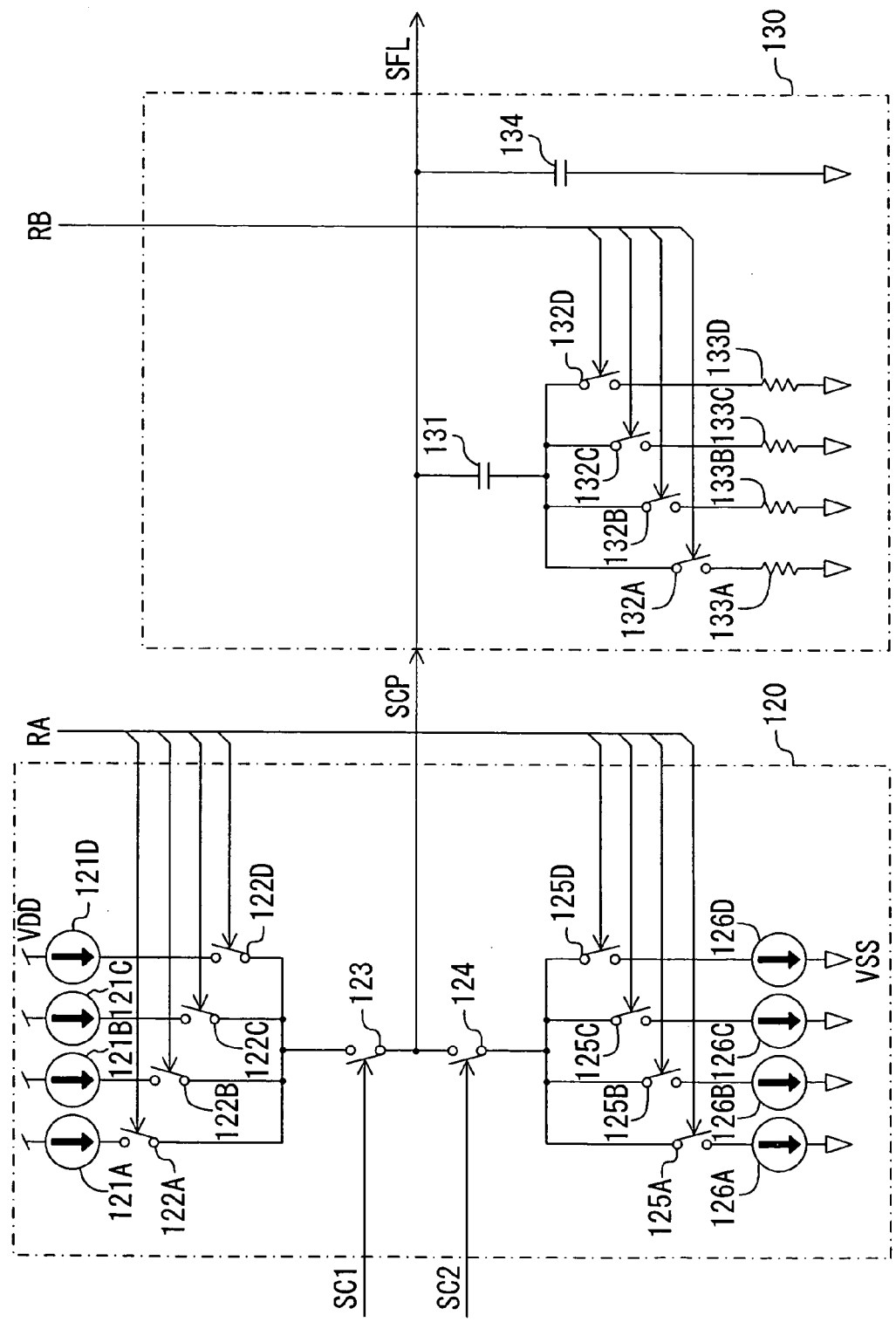
FIG. 8 is a circuit diagram of a charge pump circuit and a filter in FIG. 7.

FIG. 8 is a circuit diagram of the charge pump circuit 120 and the filter 130 in FIG. 7. The charge pump circuit 120 includes current sources 121A, 121B, 121C, 121D, 126A, 126B, 126C and 126D and switches 122A, 122B, 122C, 122D, 123, 124, 125A, 125B, 125C and 125D.

The switches 122A to 122D, respectively connected in series to the current sources 121A to 121D, are controlled with the values of corresponding bits of the output RA of the register A. Likewise, the switches 125A to 125D, respectively connected in series to the current sources 126A to 126D, are controlled with the values of corresponding bits of the output RA of the register A.

The switches 123 and 124 are controlled with the phase comparison results SC1 and SC2, respectively. When the switch 123 is turned ON, the sum of currents supplied from the power supply VDD through the switches 122A to 122D flows to the filter 130 as the charge pump output SCP. When the switch 124 is turned ON, the sum of currents flowing from the filter 130 through the switches 125A to 125D flows to the power supply VSS. Thus, the magnitude of the current flowing as the charge pump output SCP changes with the output RA of the register A, and the direction of the current flowing as the charge pump output SCP changes with the phase comparison results SC1 and SC2. In this way, the response frequency of the PLL circuit 100 can be changed.

The filter 130 includes capacitors 131 and 134, switches 132A, 132B, 132C and 132D and resistances 133A, 133B, 133C and 133D. The switches 132A to 132D are controlled with the values of corresponding bits of the output RB of the register B.

One terminal of the capacitor 131 is connected to the charge pump output SCP, and the voltage at this terminal is given to the voltage-controlled oscillator 140 as the filter output SFL. Four circuits respectively composed of the switches 132A to 132D and the resisters 133A to 133D connected in series to each other are connected between the other terminal of the capacitor 131 and the power supply VSS. Thus, the characteristic of the filter 130 changes with the output RB of the register B, and in this way, the damping factor of the PLL circuit 100 can be changed.

Figure 9:
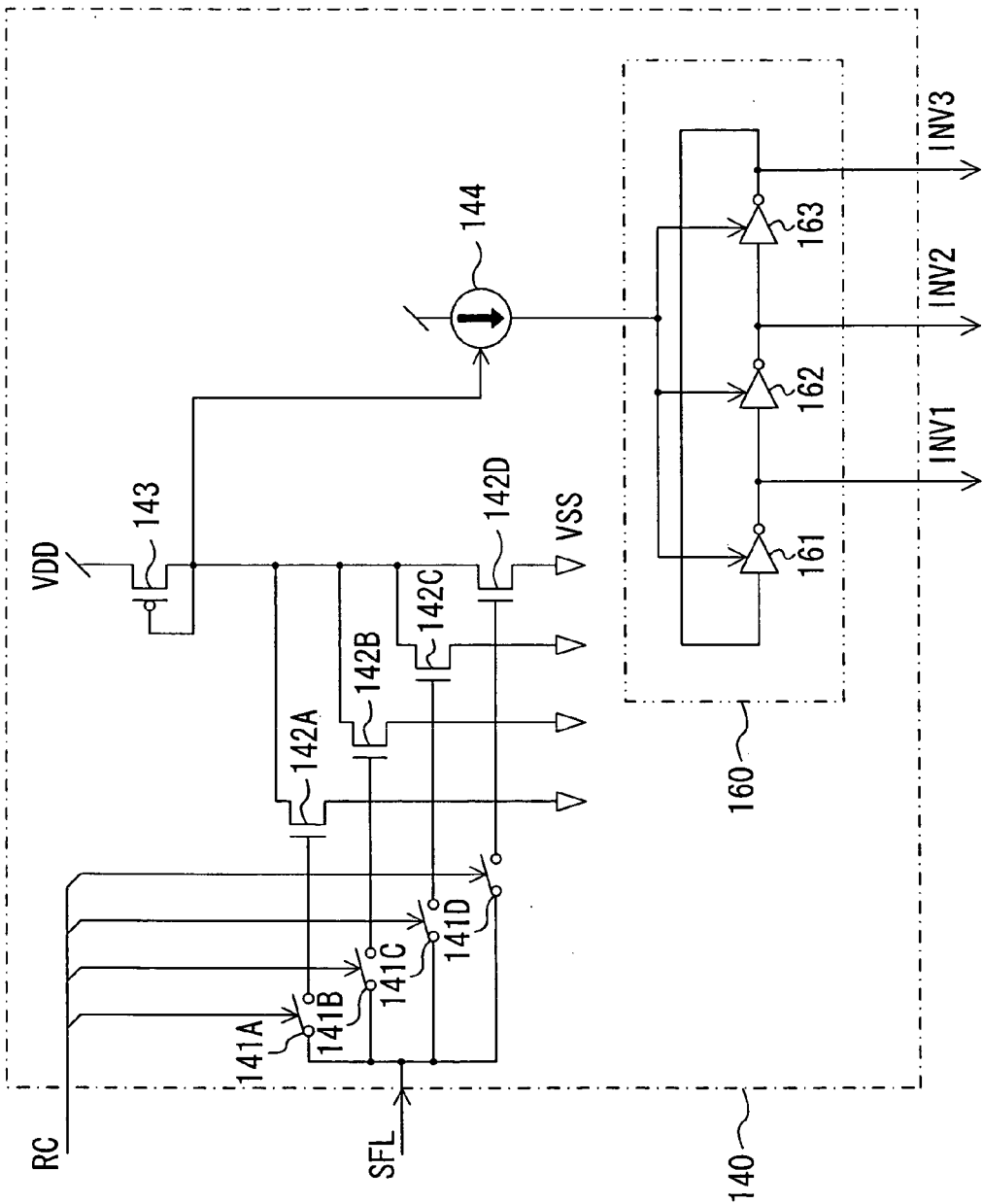
FIG. 9 is a circuit diagram of a voltage-controlled oscillator in FIG. 7.

FIG. 9 is a circuit diagram of the voltage-controlled oscillator 140 in FIG. 7. The voltage-controlled oscillator 140 includes switches 141A, 141B, 141C and 141D, NMOS transistors 142A, 142B, 142C and 142D, a PMOS transistor 143, a current source 144 and an inverter chain circuit 160. The inverter chain circuit 160 includes inverters 161, 162 and 163 connected in a loop.

The switches 141A to 141D are placed to give the filter output SFL to the gates of the NMOS transistors 142A to 142D according to the values of corresponding bits of the output RC of the register C. The drains of the NMOS transistors 142A to 142D are connected to the gate and drain of the PMOS transistor 143, and the sources thereof are connected to the power supply VSS. The source of the PMOS transistor 143 is connected to the power supply VDD, and the voltage at the drain of the PMOS transistor 143 is given to the current source 144 as its control voltage. Thus, the gain, which is the magnitude of the current of the current source 144 with respect to the filter output SFL, changes with the output RC of the register C.

The current source 144 supplies the current to the inverters 161 to 163 as the control signal for these inverters. The delays generated in these inverters change with the output RC of the register C, and thus the frequencies of signals INV1, INV2 and INV3 output from the voltage-controlled oscillator 140 can be changed. The output signal INV2 of the inverter 162, for example, is output to the frequency divider 150.

Figure 10:
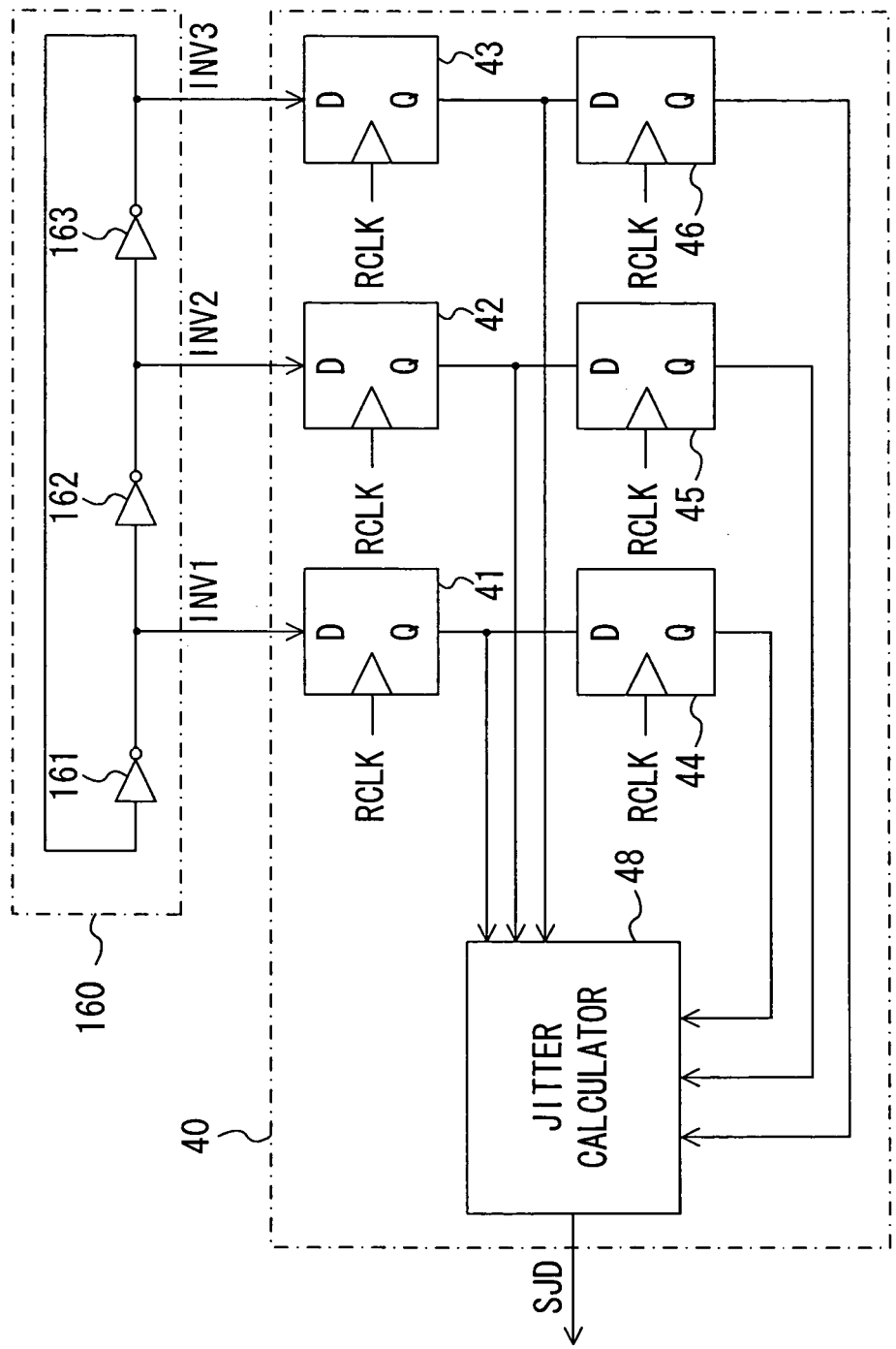
FIG. 10 is a block diagram of a jitter detector in FIG. 7.

FIG. 10 is a block diagram of the jitter detector 40 in FIG. 7. The jitter detector 40 includes flipflops 41, 42, 43, 44, 45 and 46 and a jitter calculator 48. The flipflops 41 to 43 receive the output signals INV1 to INV3 of the inverters 161 to 163, respectively. The outputs of the flipflop 41 to 43 are input into the flipflops 44 to 46, respectively. The outputs of the flipflop 41 to 46 are given to the jitter calculator 48. The flipflop 41 to 46 operate in synchronization with the same reference clock RCLK.

The jitter calculator 48 can detect a change in the level of the signal INV1 from the outputs of the flipflops 41 and 44. Likewise, the jitter calculator 48 can detect a change in the level of the signal INV2 from the outputs of the flipflops 42 and 45 and a change in the level of the signal INV3 from the outputs of the flipflops 43 and 46. The jitter calculator 48 determines the state of the entire inverter chain circuit 160 from the detected level changes of the signals INV1 to INV3.

Figures 11A, 11B:
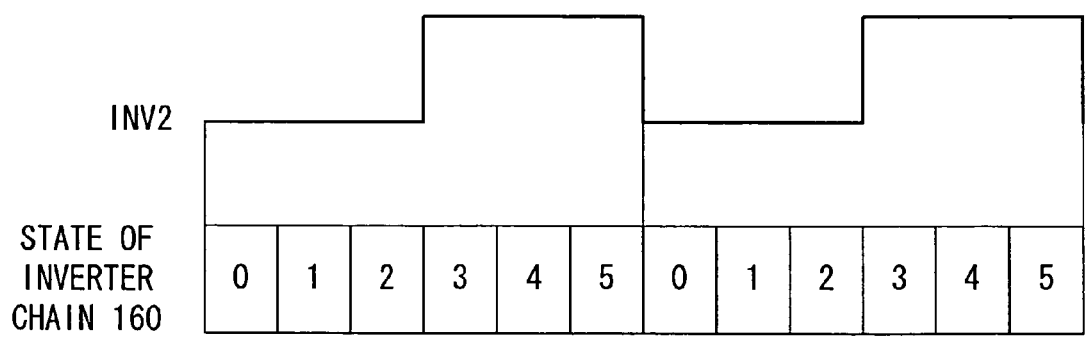
FIG. 11A is a view showing the correspondence between the state of an inverter chain circuit and the outputs of individual inverters.
FIG. 11B is a view showing the relationship between a waveform from the inverter chain circuit and the state of this circuit.

FIG. 11A is a view showing the correspondence between the state of the inverter change circuit 160 and the outputs of the individual inverters. FIG. 11B is a view showing the relationship between a waveform from the inverter chain circuit 160 and the state of the circuit.

As combinations of the output signals INV1 to INV3 of the inverters 161 to 163, a total of six combinations as expressed as states 0 to 5 in FIG. 11A are available. Note that "H" and "L" refer to the high and low logical levels, respectively, and the states 0 to 5 refer to the states of the entire inverter chain circuit 160. The inverter chain circuit 160 shifts its state in the order of the states 0 to 5 sequentially during one period of the signals INV1 to INV3. Therefore, the relationship between the signal INV2, for example, and the state of the inverter chain circuit 160 is as shown in FIG. 11B.

The jitter calculator 48 samples the output signal INV2 of the inverter 162, for example, to examine the state of the entire inverter chain circuit 160, determines the number of stages by which the state has changed, integrates the results, and outputs the integrated results as the jitter SJD. Assuming that the division ratio of the frequency divider 150 is 24, the inverter chain circuit 160 repeats the series of the states 0 to 5 24 times during one period of the reference clock RCLK. In other words, the duration of one state of the states 0 to 5 is 1/(24×6) times the period of the reference clock RCLK. PLL circuits are normally usable as long as the jitter is 1% or less. Thus, optimization of the PLL circuit 100 can be attained by measuring the jitter with the circuit shown in FIG. 10.

Figure 12:
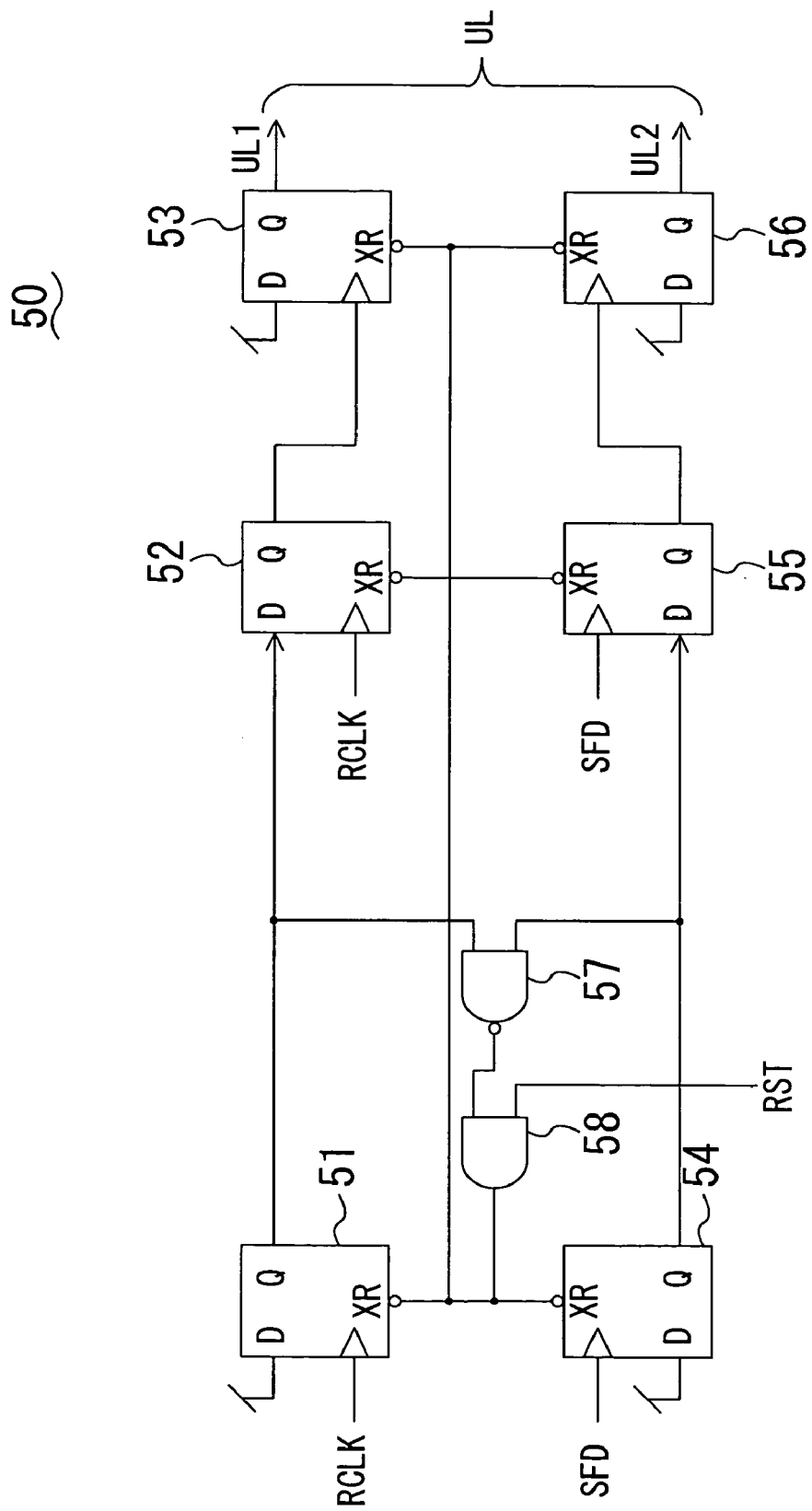
FIG. 12 is a block diagram of an unlock detector in FIG. 7.

FIG. 12 is a block diagram of the unlock detector 50 in FIG. 7. The unlock detector 50 includes flipflops 51, 52, 53, 54, 55 and 56, a NAND gate 57 and an AND gate 58.

The voltage VDD is input into the flipflops 51, 53, 54 and 56. The outputs of the flipflops 51 and 54 are input into the flipflops 52 and 55, respectively. The outputs of the flipflops 52 and 55 are supplied to the flipflops 53 and 56, respectively, as the clocks. The reference clock RCLK is supplied to the flipflops 51 and 52, and the frequency divider output SFD is supplied to the flipflops 54 and 55, both as the clocks. The outputs UL1 and UL2 of the flipflops 53 and 56, respectively, are output as the unlock signal UL.

In FIG. 12, the reset signal RST is kept "H" throughout the operation except for the time of resetting. When both the outputs of the flipflops 51 and 54 become "H", the output of the NAND gate 57 and then the output of the AND gate 58 go "L". This results in resetting the flipflops 51 to 56, and thus the outputs UL1 and UL2 of the flipflops 53 and 56 are kept "L" indicating that no unlock is detected.

In other words, when one of the input signals, the reference clock RCLK or the frequency divider output SFD, gives two consecutive rising edges before the other signal gives its rising edge, the unlock detector 50 turns one of the outputs UL1 and UL2 of the flipflops 53 and 56 to "H", indicating that a frequency difference exists between the two input signals.

To state differently, if a frequency difference exists between the reference clock RCLK used for the comparison by the phase comparator 110 and the output SFD of the frequency divider 150, this indicates that the PLL circuit is out of synchronization. The unlock detector 50 determines this as an abnormal state and notifies the first and second characteristic change sections 72 and 74 and the control section 82 of the detection of the abnormal state by means of the unlock signal UL.

The sequence for application of two algorithms adopted by the system of FIG. 7 is substantially the same as that described above with reference to FIG. 2. Hereinafter, the global search algorithm used in the first characteristic change section 72 in FIG. 7 will be described in detail.

Figure 13:
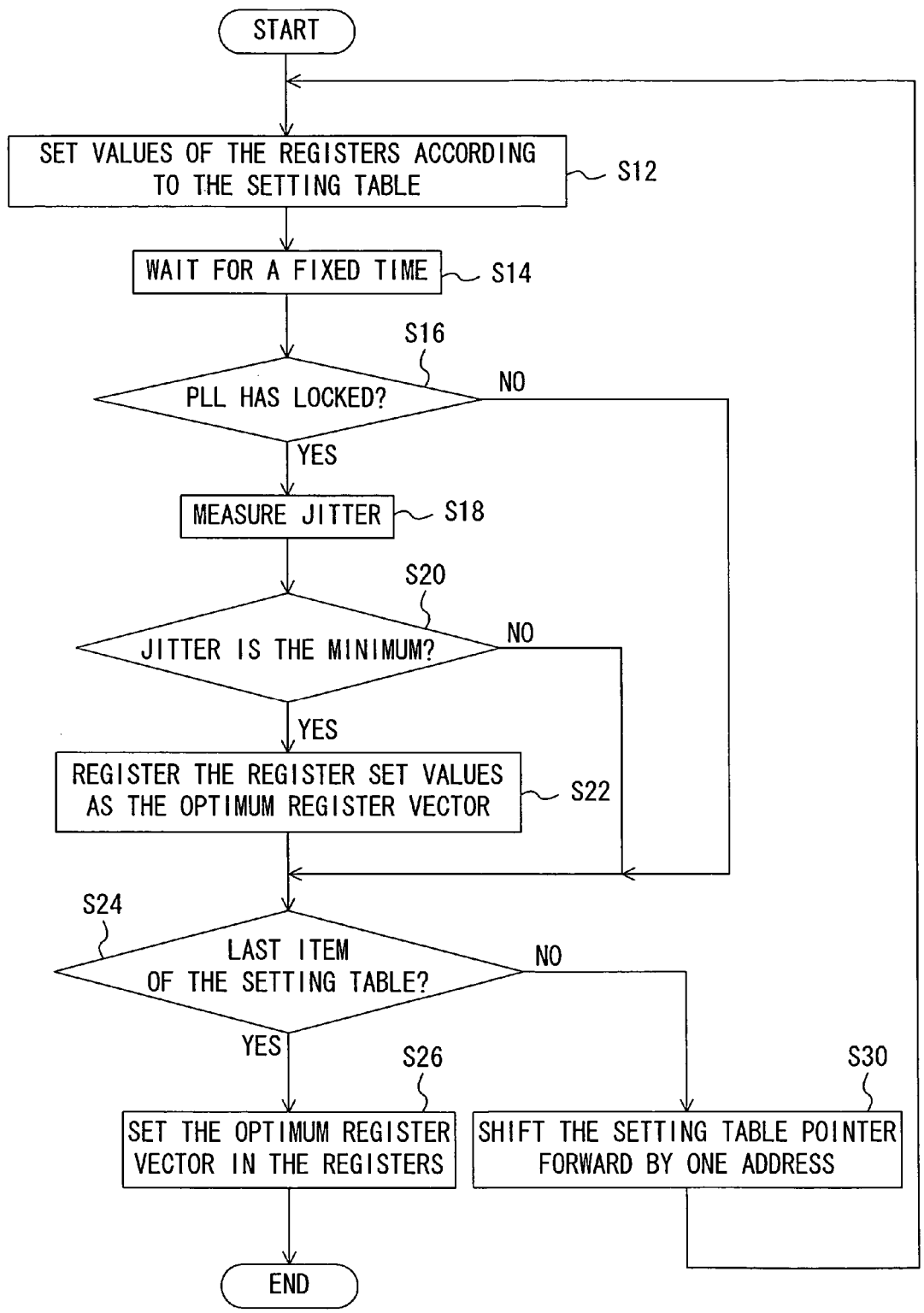
FIG. 13 is a flowchart showing a flow of processing in a first characteristic change section in FIG. 7.

FIG. 13 is a flowchart showing a flow of processing in the first characteristic change section 72 in FIG. 7. The first characteristic change section 72 determines values to be set in the register group 86 so that the characteristics of the output of the PLL circuit 100 are optimized, using the global search algorithm. Assume that the control section 82 instructs the selector 84 to select the output of the first characteristic change section 72.

As in Embodiment 1, the first characteristic change section 72 stores a register value setting table therein. The register value setting table contains a plurality of combinations (register vectors) of three values to be stored in the registers A, B and C of the register group 86. The register value setting table covers all possible combinations of values that can be set in the registers A, B and C, for example. In the register value setting table, addresses are provided for the respective register vectors. A setting table pointer for pointing to the address of a register vector is made to point to the head of the register value setting table.

Referring to FIG. 13, in step S12, the first characteristic change section 72 selects a register vector pointed to by the setting table pointer from the register value setting table, and sets the components of the selected register vector as the values of the registers A, B and C of the register group 86. In step S14, the first characteristic change section 72 waits for a fixed time.

In step S16, the first characteristic change section 72 determines whether or not the PLL circuit 100 has locked, from the unlock signal UL output from the unlock detector 50. If having locked, the process proceeds to step S18. If not, the process proceeds to step S24. In step S18, the first characteristic change section 72 receives the jitter value SJD measured by the jitter detector 40.

In step S20, the first characteristic change section 72 determines whether or not the jitter value SJD is the minimum among the jitter values measured after the start of the flow of FIG. 13. If so, the process proceeds to step S22. Otherwise, process proceeds to step S24. In step S22, the first characteristic change section 72 registers the values currently set in the registers A, B and C, that is, the currently selected register vector, as the optimum register vector.

In step S24, the first characteristic change section 72 determines whether or not the pointer has reached the last item of the setting table. If reached, the process proceeds to step S26. Otherwise, the process proceeds to step S30. In step S26, the first characteristic change section 72 sets the components of the registered optimum register vector in the registers A, B and C, and then the processing is terminated. In step S30, the first characteristic change section 72 shifts the setting table pointer forward by one address, and the process returns to step S12.

The flow described above is followed for all the register vectors registered in the register value setting table, and finally, the components of the optimum register vector are set in the registers A to C of the register group.

Figure 14:
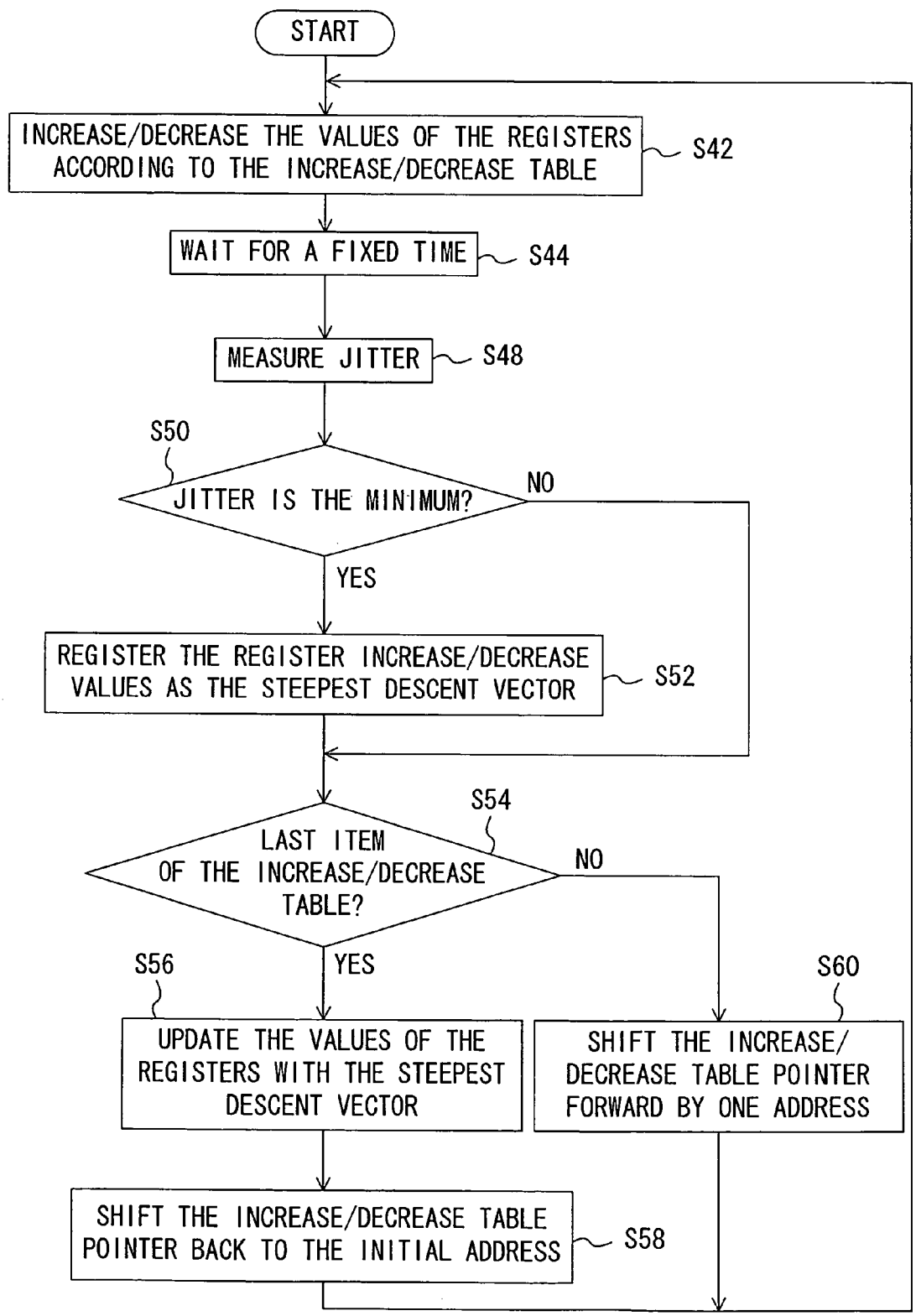
FIG. 14 is a flowchart showing a flow of processing in a second characteristic change section in FIG. 7.

Next, the steepest descent algorithm used by the second characteristic change section 74 in FIG. 7 will be described in detail. FIG. 14 is a flowchart showing a flow of processing in the second characteristic change section 74. As shown in FIG. 2, after the setting of values in the register group 86 by the first characteristic change section 72, the second characteristic change section 74 determines optimum values to be set in the register group 86 so that the characteristics of the output of the PLL circuit 100 output from the jitter detector 40 are optimized, using the steepest descent algorithm. Assume that the control section 82 instructs the selector 84 to select the output of the second characteristic change section 74.

As in Embodiment 1, the second characteristic change section 74 stores a register value increase/decrease table therein. The register value increase/decrease table has a plurality of combinations (direction vectors) of three values to be added to the respective three values stored in the registers A, B and C of the register group 86. For example, the register value increase/decrease table has direction vectors as shown in FIG. 3. Addresses are provided for the respective direction vectors in the register value increase/decrease table. An increase/decrease table pointer for pointing to the address of a direction vector is made to point to the head of the register value increase/decrease table. The second characteristic change section 74 stores the set values in the registers A to C of the register group 86 therein prior to the start of the flow of FIG. 14.

Referring to FIG. 14, in step S42, the second characteristic change section 74 selects a direction vector pointed to by the increase/decrease table pointer from the register value increase/decrease table, and adds the components of the direction vector to the values of the registers A, B and C. The values of the registers A, B and C increase or decrease according to the direction vector. In step S44, the second characteristic change section 74 waits for a fixed time. In step S48, the second characteristic change section 74 receives the jitter value SJD measured by the jitter detector 40.

In step S50, the second characteristic change section 74 determines whether or not the jitter value SJD is the minimum among the jitter values measured after the start of the flow of FIG. 14. If so, the process proceeds to step S52. Otherwise, process proceeds to step S54. In step S52, the second characteristic change section 74 registers the increase/decrease values for the registers A, B and C, that is, the currently selected direction vector, as the steepest descent vector.

In step S54, the second characteristic change section 74 determines whether or not the pointer has reached the last item of the increase/decrease table. If reached, the process proceeds to step S56. Otherwise, the process proceeds to step S60. In step S56, the second characteristic change section 74 adds the components of the registered steepest descent vector to the set values of the registers A to C stored therein, to update the values of the registers A to C.

In step S58, the second characteristic change section 74 shifts the increase/decrease table pointer back to the initial address (head address of the increase/decrease table), and the process returns to step S42. In step S60, the second characteristic change section 74 shifts the address pointed to by the increase/decrease table pointer by one, and the process returns to step S42.

The flow described above is followed for all the direction vectors registered in the register value increase/decrease table, and finally the steepest descent vector is determined. Values increased/decreased according to the steepest descent vector are set in the registers A to C of the register group 86.

As described above, by the combined use of the global search algorithm and the steepest descent algorithm, it is possible to control the output of the register group 86 so that the jitter of the PLL circuit 100 is always minimum.

In the above embodiments, the set value storage section and the register group had three registers. Alternatively, registers of a number other than three may be provided according to the circuit to be calibrated.

Otherwise, the output of one register may be divided into a plurality of fields, and the values of the respective fields may be used as the set values.

As described above, the analog circuit automatic calibration system of the present invention is useful for equipment requiring use of an analog circuit of which characteristics must be calibrated optimally at all times.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. An analog circuit automatic calibration system for calibrating an object circuit that is an analog circuit having a characteristic changing with an input set value, the system comprising:

a set value storage section for storing a value and outputting the value to the object circuit as the set value;

a characteristic detection section for detecting the characteristic of the object circuit and outputting the results;

a first characteristic change section for determining the set value based on the results of the characteristic detection section so that the characteristic of the object circuit is optimized and outputting the results;

a second characteristic change section for determining a value updated from the set value based on the results of the characteristic detection section so that the characteristic of the object circuit is maintained, using an algorithm different from that used in the first characteristic change section; and a selector for selecting either one of the outputs of the first and second characteristic sections, to enable the selected one to be stored in the set value storage section.

2. The system of claim 1, wherein the first characteristic change section determines the set value using a global search algorithm, and the second characteristic change section determines the updated value using a steepest descent algorithm.

3. The system of claim 1, further comprising:

an abnormal event detection section for detecting occurrence of an abnormal event in the circuit, and outputting a signal indicating the detection; and a control section for controlling the selector to select the output of the first characteristic change section if the abnormal event detection section detects occurrence of an abnormal event, and otherwise select the output of the second characteristic change section.

4. The system of claim 1, further comprising a control section for controlling the selector to select the output of the first characteristic change section at startup of the object circuit, and select the output of the second characteristic change section after the determination of the set value to be output to the object circuit by the first characteristic change section.

5. The system of claim 1, wherein the second characteristic change section starts the updating of the set value if the characteristic detected by the characteristic detection section satisfies a predetermined start condition, and thereafter terminates the updating of the set value if a predetermined end condition is satisfied.

6. The system of claim 1, wherein the object circuit changes its characteristic with a plurality of set values, and the first characteristic change section selects a combination of values, among a plurality of combinations each having a plurality of values, so that with supply of the selected combination of values, the characteristic of the object circuit is optimized, and outputs the results.

7. The system of claim 1, wherein the object circuit changes its characteristic with a plurality of set values, and the second characteristic change section selects a vector, among a plurality of vectors each having a plurality of components corresponding to the plurality of set values, so that with addition of corresponding components of the selected vector to the plurality of set values, the characteristic of the object circuit becomes closest to an optimum characteristic, updates the plurality of set values by adding the corresponding components of the selected vector to the plurality of set values, and outputs the results.

8. The system of claim 1, wherein the object circuit is a phase-locked loop circuit.

9. The system of claim 8, wherein the object circuit includes a voltage-controlled oscillator, and the characteristic detection section detects jitter of the voltage-controlled oscillator as a characteristic of the object circuit.

10. The system of claim 9, wherein the characteristic detection section samples logical levels at a plurality of points in the voltage-controlled oscillator according to a reference clock supplied to the object circuit, and determines jitter of the voltage-controlled oscillator based on the resultant logical levels.

* * * * *